United States Patent
Dijksman et al.

(10) Patent No.: US 8,743,361 B2
(45) Date of Patent: Jun. 3, 2014

(54) IMPRINT LITHOGRAPHY METHOD AND APPARATUS

(75) Inventors: Johan Frederik Dijksman, Weert (NL); Arie Jeffrey Den Boef, Waalre (NL); Sander Frederik Wuister, Eindhoven (NL); Martinus Bernardus Van Der Mark, Best (NL)

(73) Assignee: ASML Netherlands B.V., Veldhoven (NL)

( * ) Notice: Subject to any disclaimer, the term of this patent is extended or adjusted under 35 U.S.C. 154(b) by 307 days.

(21) Appl. No.: 13/098,759

(22) Filed: May 2, 2011

(65) Prior Publication Data
US 2011/0266706 A1    Nov. 3, 2011

Related U.S. Application Data

(60) Provisional application No. 61/330,622, filed on May 3, 2010.

(51) Int. Cl.
| | | |
|---|---|---|
| *G01B 11/00* | (2006.01) | |
| *B41F 1/34* | (2006.01) | |
| *B41F 21/12* | (2006.01) | |
| *B41F 21/14* | (2006.01) | |
| *B41L 1/02* | (2006.01) | |
| *B41L 3/02* | (2006.01) | |
| *B41L 3/08* | (2006.01) | |

(52) U.S. Cl.
USPC .......................... 356/401; 101/485; 101/486

(58) Field of Classification Search
None
See application file for complete search history.

(56) References Cited

U.S. PATENT DOCUMENTS

| | | | |
|---|---|---|---|
| 4,731,155 A | 3/1988 | Napoli et al. | |
| 5,772,905 A | 6/1998 | Chou | |
| 6,334,960 B1 | 1/2002 | Willson et al. | |
| 7,281,921 B2 * | 10/2007 | Watts et al. | 425/385 |
| 7,440,079 B2 * | 10/2008 | Den Boef et al. | 355/55 |
| 7,618,250 B2 * | 11/2009 | Van Santen et al. | 425/171 |
| 7,876,440 B2 * | 1/2011 | Mieher et al. | 356/401 |
| 7,960,074 B2 * | 6/2011 | Mickan et al. | 430/5 |
| 8,248,608 B2 * | 8/2012 | Den Boef | 356/401 |

(Continued)

FOREIGN PATENT DOCUMENTS

WO    02/067055    8/2002

OTHER PUBLICATIONS

J. Haisma, "Mold-assisted nanolithography: A process for reliable pattern replication," J. Vac. Sci. Technol. vol. B14, No. 6, pp. 4124-4128 (Nov./Dec. 1996).

*Primary Examiner* — Gordon J Stock, Jr.
(74) *Attorney, Agent, or Firm* — Pillsbury Winthrop Shaw Pittman LLP

(57) ABSTRACT

A method of aligning a substrate and an imprint template is disclosed. The method includes directing an alignment radiation beam towards an imprint template alignment mark and an adjacent substrate alignment mark, the imprint template alignment mark and the substrate alignment mark each including a grating which extends in a first direction and a grating which extends in a second direction, providing relative movement between the imprint template and the substrate in the first direction and in the second direction, using an intensity detector to detect the intensity of alignment radiation redirected in the zero-order direction by the imprint template alignment mark and the substrate alignment mark during the relative movement in the first direction and in the second direction, and determining an aligned position of the imprint template alignment mark and the substrate alignment mark based upon the detected intensity.

16 Claims, 5 Drawing Sheets

(56) References Cited

U.S. PATENT DOCUMENTS

| | | | |
|---|---|---|---|
| 8,319,968 B2* | 11/2012 | Den Boef et al. | 356/401 |
| 8,529,823 B2* | 9/2013 | Den Boef et al. | 264/408 |
| 2004/0021866 A1 | 2/2004 | Watts et al. | |
| 2004/0124566 A1 | 7/2004 | Sreenivasan et al. | |
| 2005/0274693 A1 | 12/2005 | Heidari et al. | |
| 2006/0007440 A1 | 1/2006 | Kuroda et al. | |
| 2006/0157444 A1* | 7/2006 | Nakamura et al. | 216/54 |
| 2007/0172967 A1* | 7/2007 | Katagiri et al. | 438/14 |
| 2007/0266875 A1 | 11/2007 | Berge | |
| 2008/0002213 A1* | 1/2008 | Weiss | 356/620 |
| 2008/0212097 A1* | 9/2008 | Mos et al. | 356/400 |
| 2009/0169662 A1 | 7/2009 | Nimmakayala et al. | |
| 2012/0225152 A1* | 9/2012 | Wuister et al. | 425/150 |
| 2012/0313295 A1* | 12/2012 | Den Boef et al. | 264/406 |

\* cited by examiner

IMPRINT LITHOGRAPHY METHOD AND APPARATUS

This application claims priority and benefit under 35 U.S.C. §119(e) to U.S. Provisional Patent Application No. 61/330,622, entitled "Imprint Lithography Method and Apparatus", filed on May 3, 2010. The content of that application is incorporated herein in its entirety by reference.

FIELD

The present invention relates to an imprint lithography method and apparatus.

BACKGROUND

In lithography, there is an ongoing desire to reduce the size of features in a lithographic pattern in order to increase the density of features on a given substrate area. In photolithography, the push for smaller features has resulted in the development of technologies such as immersion lithography and extreme ultraviolet (EUV) lithography, which are however rather costly.

A potentially less costly road to smaller features (e.g. micron size or nanometer sized features, e.g., less than or equal to 10 microns, less than or equal to 1 micron, less than or equal to 50 nm, less than or equal 25 nm or less than or equal to 10 nm sized features) that has gained increasing interest is so-called imprint lithography, which generally involves the use of a "stamp" (often referred to as an imprint lithography template) to transfer a pattern onto a substrate. An advantage of imprint lithography is that the resolution of the features is not limited by, for example, the emission wavelength of a radiation source or the numerical aperture of a projection system. Instead, the resolution is mainly limited to the pattern density on the imprint lithography template.

Imprint lithography involves the patterning of an imprintable medium on a surface of a substrate to be patterned. The patterning may involve bringing together a patterned surface of an imprint lithography template and a layer of imprintable medium (e.g., moving the imprint lithography template toward the imprintable medium, or moving the imprintable medium toward the imprint lithography template, or both) such that the imprintable medium flows into recesses in the patterned surface and is pushed aside by protrusions on the patterned surface, to adopt the topography of that patterned surface. The recesses define pattern features of the patterned surface of the imprint template. Typically, the imprintable medium is flowable when the patterned surface and the imprintable medium are brought together. Following patterning of the imprintable medium, the imprintable medium is suitably brought into a non-flowable or frozen state (i.e. a fixed state), for example by illuminating the imprintable medium with actinic radiation. The patterned surface of the imprint lithography template and the patterned imprintable medium are then separated. The substrate and patterned imprintable medium are then typically processed further in order to pattern or further pattern the substrate. The imprintable medium may be provided in the form of droplets (e.g. deposited by ink jet printing) on the surface of a substrate to be patterned, but may alternatively be provided using spin coating or the like.

In some instances, imprint lithography may be used to imprint a pattern onto a substrate which has previously received a pattern (or more than one pattern). Where this is the case, it is desirable to align the patterned surface of the imprint template with the pattern already present on the substrate. One known way by which this may be achieved uses alignment marks provided on the imprint template and on the substrate. The relative positions of the imprint template alignment marks and the substrate alignment marks are measured using a detector. The substrate (or the imprint template) is then moved with respect to the imprint template (or with respect to the substrate) until the substrate and the imprint template are aligned. The imprint template alignment marks and the substrate alignment marks may be diffraction gratings. Where this is the case, separate diffraction gratings and associated detectors are conventionally provided for alignment in the x and y directions (according to convention the x and y directions lie parallel to the surface of the substrate).

SUMMARY

It is desirable to provide an imprint lithography method and apparatus which uses less alignment detectors than at least some prior imprint lithography apparatus and methods.

According to an aspect, there is provided a method of aligning a substrate and an imprint template, the method comprising: directing an alignment radiation beam towards an imprint template alignment mark of the imprint template and an adjacent substrate alignment mark of the substrate, the imprint template alignment mark and the substrate alignment mark each comprising a grating which extends in a first direction and a grating which extends in a second direction; providing relative movement between the imprint template and the substrate in the first direction and in the second direction; using an intensity detector to detect the intensity of alignment radiation redirected in the zero-order direction by the imprint template alignment mark and the substrate alignment mark during the relative movement in the first direction and in the second direction; and determining an aligned position of the imprint template alignment mark and the substrate alignment mark based upon the detected intensity.

According to an aspect, there is provided an imprint lithography alignment apparatus comprising: an alignment radiation source outlet configured to provide an alignment radiation beam at an imprint template alignment mark and a substrate alignment mark, the imprint template alignment mark and the substrate alignment mark each comprising a grating which extends in a first direction and a grating which extends in a second direction; an intensity detector to detect the intensity of alignment radiation redirected in the zero-order direction by the imprint template alignment mark and the substrate alignment mark; an actuator to generate relative movement between the substrate and the imprint template in the first direction and in the second direction; and a processor to determine an aligned position of the imprint template alignment mark and the substrate alignment mark based upon the detected intensity.

According to an aspect, there is provided an imprint template alignment mark comprising a first grating which extends in a first direction and a second adjacent grating which extends in a second substantially perpendicular direction, the first and second gratings together forming a square or rectangle, and the imprint template alignment mark comprising no additional gratings.

According to an aspect, there is provided an imprint template alignment mark comprising a pair of triangular gratings which extend in a first direction and a pair of triangular gratings which extend in a second direction transverse to the first direction, the triangular gratings having apexes which come together at a central location.

BRIEF DESCRIPTION OF THE DRAWINGS

Specific embodiments of the invention will be described with reference to the accompanying figures, in which.

DETAILED DESCRIPTION

Figure 1A:
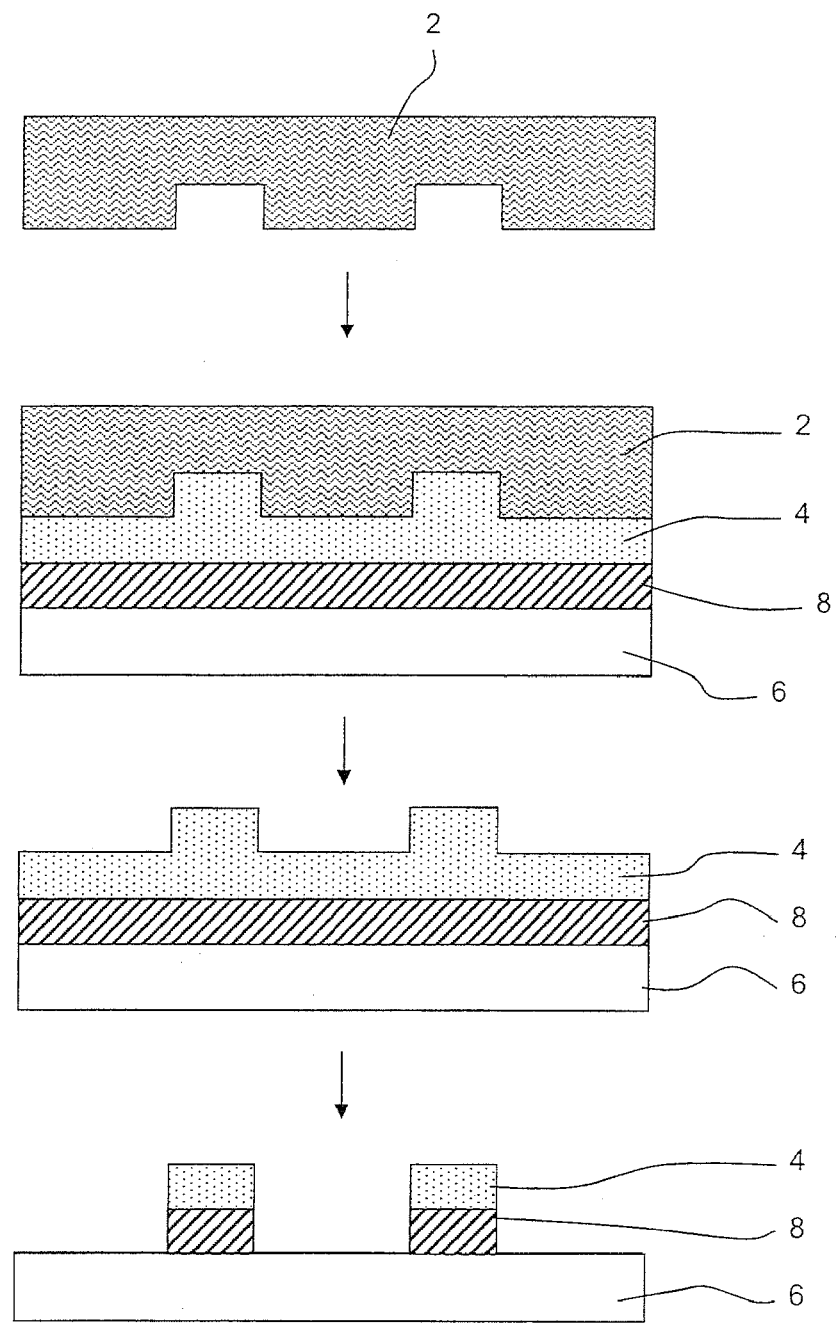
FIGS. 1A and 1B schematically depict examples of, respectively, hot imprint, and UV imprint lithography.
Figure 1B:
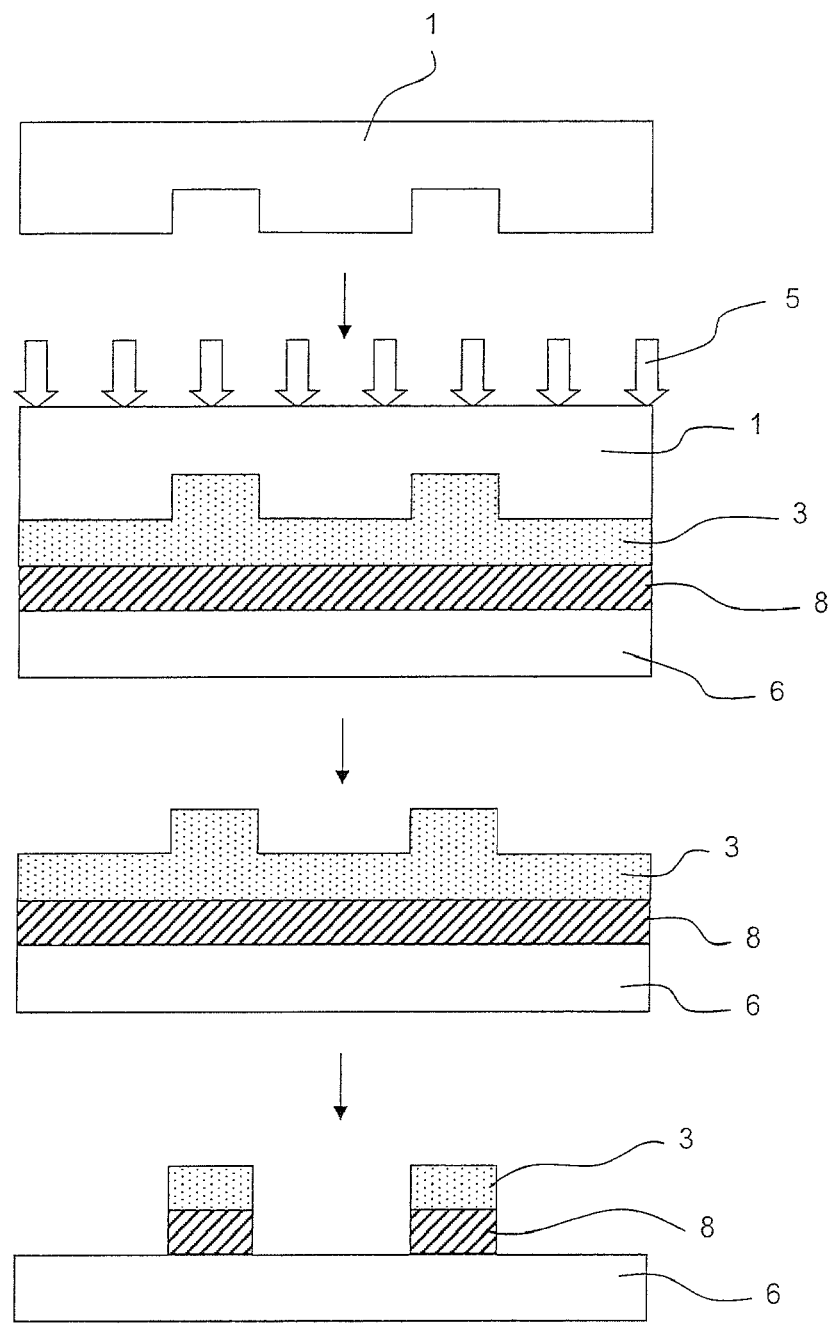

Examples of approaches to imprint lithography are schematically depicted in FIGS. 1A and 1B.

FIG. 1A shows an example of so-called hot imprint lithography (or hot embossing). In a typical hot imprint process, a template 2 is pressed into a thermosetting or a thermoplastic imprintable medium 4, which has been cast on the surface of a substrate 6. The imprintable medium 4 may be, for example, a resin. The resin may, for instance, be spin coated and baked onto the substrate surface or, as in the example illustrated, onto a planarization and transfer layer 8 of the substrate 6. When a thermosetting polymer resin is used, the resin is heated to a temperature such that, upon contact with the template, the resin is sufficiently flowable to flow into the pattern features defined on the template. The temperature of the resin is then increased to thermally cure (crosslink) the resin so that it solidifies and irreversibly adopts the desired pattern. The template 2 may then be removed and the patterned resin cooled. In hot imprint lithography employing a layer of thermoplastic polymer resin, the thermoplastic resin is heated so that it is in a freely flowable state immediately prior to imprinting with the template 2. It may be necessary to heat a thermoplastic resin to a temperature considerably above the glass transition temperature of the resin. The template is imprinted into the flowable resin and then the resin is cooled to below its glass transition temperature with the template 2 in place to harden the pattern. Thereafter, the template 2 is removed. The pattern will consist of the features in relief from a residual layer of the resin which may then be removed by an appropriate etch process to leave only the pattern features. Examples of thermoplastic polymer resins used in hot imprint lithography processes are poly (methyl methacrylate), polystyrene, poly (benzyl methacrylate) or poly (cyclohexyl methacrylate). For more information on hot imprint, see e.g. U.S. Pat. No. 4,731,155 and U.S. Pat. No. 5,772,905.

FIG. 1B shows an example of UV imprint lithography, which involves the use of a transparent or translucent template which is transmissive to UV and a UV-curable resin as imprintable medium (the term "UV" is used here for convenience but should be interpreted as including any suitable actinic radiation for curing the imprintable medium). A UV curable resin is often less viscous than the thermosetting and thermoplastic resins used in hot imprint lithography and consequently may move much faster to fill template pattern features. A quartz template 1 is applied to a UV-curable resin 3 in a similar manner to the process of FIG. 1A. However, instead of using heat or temperature cycling as in hot imprint, the pattern is frozen by curing the imprintable medium 3 with UV radiation 5 that is applied through the quartz template 1 onto the imprintable medium 3. After removal of the template 1, the imprintable medium 3 is etched. A particular manner of patterning a substrate through UV imprint lithography is so-called step and flash imprint lithography (SFIL), which may be used to pattern a substrate in small steps in a similar manner to optical steppers conventionally used in IC manufacture. For more information on UV imprint, see e.g. U.S. Patent Application Publication No. 2004-0124566, U.S. Pat. No. 6,334,960, PCT Patent Application Publication WO 02/067055, and the article by J. Haisma entitled "Mold-assisted nanolithography: A process for reliable pattern replication", J. Vac. Sci. Technol. B14(6), November/December 1996.

Combinations of the above imprint techniques are possible. See, e.g., U.S. Patent Application Publication No. 2005-0274693, which mentions a combination of heating and UV curing an imprintable medium.

Figure 2:
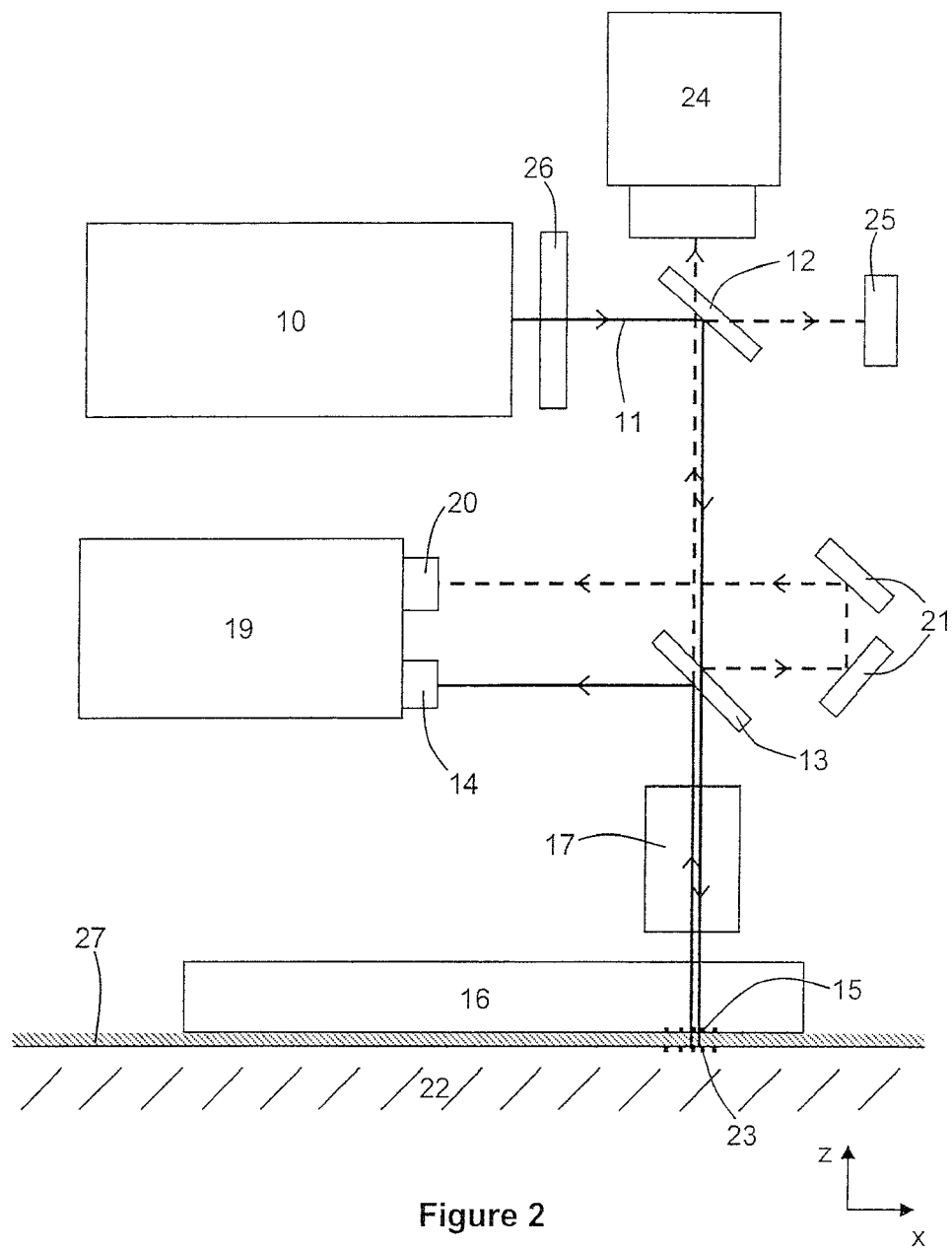
FIG. 2 schematically depicts an imprint lithography apparatus according to an embodiment of the invention.

FIG. 2 shows schematically viewed from one side an imprint lithography apparatus according to an embodiment of the invention. The apparatus comprises a laser 10 which is configured to generate an alignment radiation beam 11. The imprint lithography apparatus further comprises a alignment apparatus comprising a switchable polarizer 26, a first beam splitter 12, a second beam splitter 13 and an intensity detector 14. The first beam splitter 12 is arranged such that it directs the alignment radiation beam 11 generated by the laser 10 towards an alignment mark 15 provided on an imprint template 16 (this alignment mark is hereafter referred to as the imprint template alignment mark 15).

Also shown in FIG. 2 is a substrate 22 which is provided with an alignment mark 23 (hereafter referred to as the substrate alignment mark 23). Part of the alignment radiation beam 11 which passes through the imprint template alignment mark 15 will be incident upon the substrate alignment mark 23, from which it will be redirected back through the imprint template alignment mark 15 and via the second beam splitter 13 to the intensity detector 14. The intensity detector 14 thus receives alignment radiation which has been redirected by and from the imprint template alignment mark 15 and alignment radiation which has been redirected by and from the substrate alignment mark 23. The intensity of alignment radiation which is detected by the intensity detector 14 may be used to achieve alignment between the substrate 22 and the imprint template 16 (as described further below).

Focusing optics 17 are located between the second beam splitter 13 and the imprint template 16. The focusing optics 17 may be configured to focus the alignment radiation beam 11 onto the imprint template alignment mark 15. The imprint template alignment mark 15 and the substrate alignment mark 23 may be located sufficiently close together that they form a composite grating. The term "composite grating" may be interpreted as meaning two gratings which are configured such that a significant portion of radiation diffracted by one of the gratings is incident upon the other grating. The imprint template alignment mark 15 and the substrate alignment mark 23 may, for example, be separated by a gap of 20-50 nm. The gap may be, for example, filled with imprintable medium 27.

The alignment apparatus further comprises a reference intensity detector 20 is located adjacent to the intensity detector 14. The second beam splitter 13 splits off a portion of the alignment radiation beam 11 coming from the first beam splitter 12, which is directed to the reference intensity detector 20 via, for example, a pair of mirrors 21. The portion of the alignment radiation beam 11 which travels to the reference intensity detector 20 is shown with a dashed line, to distinguish it from radiation which travels to the intensity detector 14.

The alignment apparatus further comprises an imaging detector 24 (e.g. a CCD camera) which is located behind the first beam splitter 12. Some of the alignment radiation beam 11 which is redirected by the imprint template alignment mark 15 and the substrate alignment mark 23 will pass via the first and the second beam splitters 12, 13 to the imaging detector 24 (as indicated by a dashed line).

The alignment apparatus further comprises a beam stop 25 which is positioned to receive a portion of the alignment radiation beam 11 which is not reflected by the first beam splitter 12 (the alignment radiation is represented by a dashed line).

Figure 3:
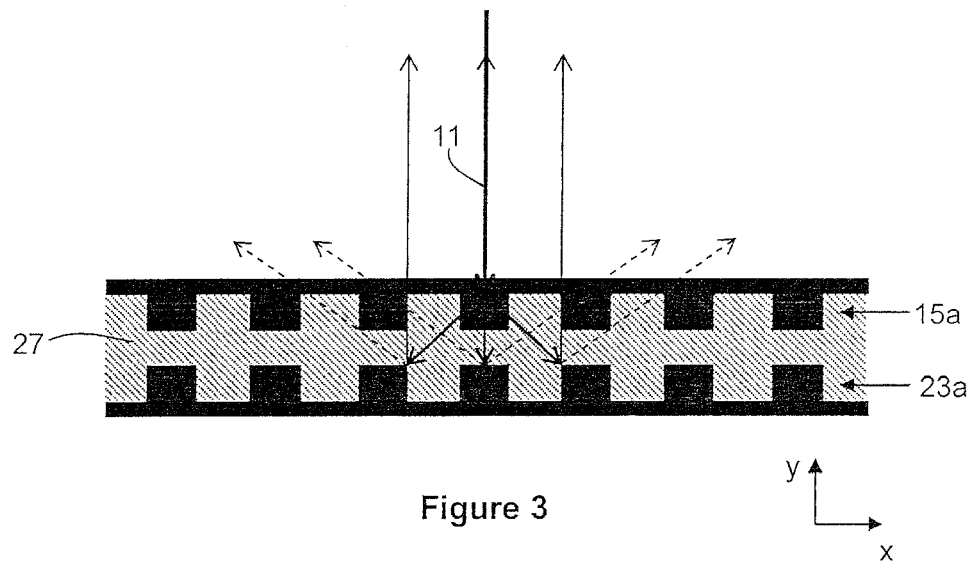
FIG. 3 schematically depicts diffraction between an imprint template alignment mark and a substrate alignment mark according to an embodiment of the invention.

As mentioned above, a composite grating is formed by the imprint template alignment mark 15 and the substrate alignment mark 23. Referring to FIG. 3, the composite grating is formed from part of the imprint template alignment mark 15 which is a grating 15a, and part of the substrate alignment mark 23 which is a grating 23a. The imprint template grating 15a and the substrate alignment grating 23a both have a constant pitch, and both have the same pitch. The intensity of radiation which is redirected to the intensity detector 14 by the composite grating depends upon the degree to which the imprint template alignment grating 15a and the substrate alignment grating 23a are aligned. The second beam splitter 13 and the focusing optics 17 (see FIG. 2) are configured such that the intensity detector 14 receives zero-order diffraction radiation which is redirected from the imprint template alignment grating 15a and the substrate alignment grating 23a. The manner in which the alignment radiation beam 11 propagates between the imprint template alignment grating 15a and the substrate alignment grating 23a is shown schematically in FIG. 3. Zero-order radiation which is redirected from both the imprint template alignment grating 15a and the substrate alignment grating 23a contains information about the alignment of both gratings with respect to each other. As can be seen from FIG. 3, a proportion of the alignment beam 11 is diffracted in a first order by the imprint template alignment grating 15a, and is then redirected as zero-order radiation from the substrate alignment grating 23a. Although not shown in FIG. 3, a proportion of the alignment beam is diffracted in higher orders by the imprint template alignment grating 15a, and is then redirected as zero-order radiation from the substrate alignment grating 23a. Thus, it may be seen that the intensity of the zero-order redirected alignment radiation beam detected at the intensity detector 14 includes radiation arising from various diffraction orders. The intensity of the zero-order redirected alignment radiation beam thus contains information about the relative positions of the imprint template alignment grating 15a and the substrate alignment grating 23a. This information may be used to align the imprint template alignment grating 15a and the substrate alignment grating 23a. When the imprint template alignment grating 15a and the substrate alignment grating 23a are aligned as shown in FIG. 3, the intensity of the zero-order radiation is at a maximum. If the imprint template alignment grating 15a were to be misaligned by half of the grating pitch relative to the substrate alignment grating 23a, then the intensity of the zero-order radiation would be at a minimum.

Figure 4:
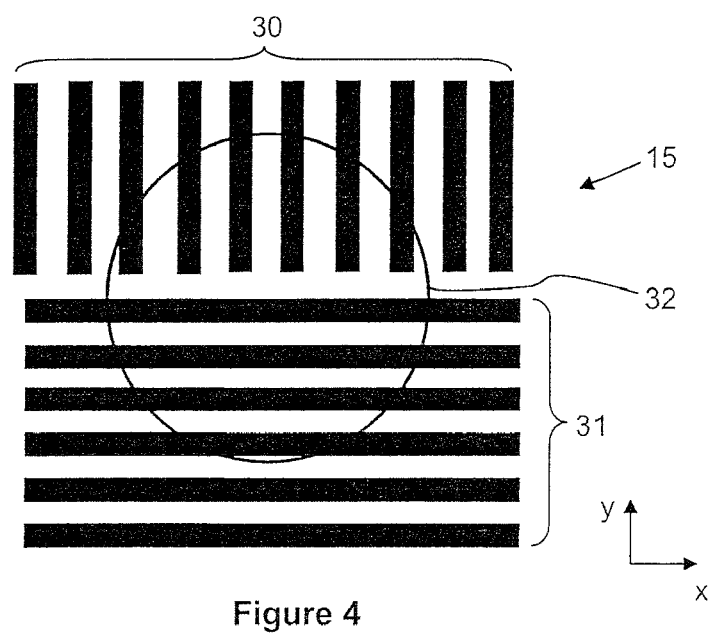
FIGS. 4 and 5 schematically depict alignment marks according to an embodiment of the invention.

FIG. 4 shows schematically an example of an imprint template alignment mark 15 which may be used according to an embodiment of the invention. The imprint template alignment mark 15 comprises a grating which extends in the x-direction (referred to hereafter as the x-direction grating 30), and further comprises a grating which extends in the y-direction (referred to hereafter as the y-direction grating 31). The x-direction grating 30 and the y-direction grating 31 may have the same pitch, or may have different pitches. The pitch of the gratings 30, 31 may be, for example, between 500 nanometers and 10 microns. The imprint template alignment mark 15 may for example have a length of between 40 microns and 100 microns and may for example have a width of between 40 microns and 100 microns. One grating may include more periods than the other grating, and may be narrower than the other grating (as shown in FIG. 4).

In operation, the alignment radiation beam 11 illuminates an area 32 (e.g., circular area) which overlaps the x-direction grating 30 and the y-direction grating 31. This area of the alignment radiation beam 11 is referred to hereafter as the alignment radiation spot 32. The alignment radiation spot 32 may have any suitable maximum cross-sectional dimension (e.g., width or diameter). It may be sufficiently small that it may be located fully within the imprint template alignment mark 15. This avoids the possibility that the alignment radiation spot 32 is incident upon patterned features previously provided on the substrate 16, and that those patterned features give rise to a noise component in the intensity detected by the intensity detector 14. The alignment radiation spot 32 may, for example, have a width or diameter of between 25 microns and 50 microns. For example, a 25 micron alignment radiation spot may be used for an imprint template alignment mark which is 40 square microns, and a 50 micron alignment radiation spot may be used for an imprint template alignment mark which is 100 square microns.

The substrate alignment mark 23 has the same dimensions and grating pitch as the imprint template alignment mark 15 shown in FIG. 4. The substrate alignment mark 23 may be provided, for example, in a scribe lane of the substrate 22.

In use, referring to FIG. 2, the substrate 22 may be positioned beneath the imprint template 16 by a substrate table and associated actuator (not illustrated). The degree of accuracy with which this positioning is performed is such that the substrate alignment mark 23 is located generally beneath the imprint template alignment mark 15. The laser 10 provides the alignment radiation beam 11, which illuminates the imprint template alignment mark 15 and the substrate alignment mark 23. This allows the imaging detector 24 to see the imprint template alignment mark 15 and the substrate alignment mark 23. The substrate 22 is moved by the substrate table, while monitoring the imprint template alignment mark 15 and the substrate alignment mark 23 using the imaging detector 24, until the imprint template alignment mark and the substrate alignment mark are aligned to within an accuracy achievable using the imaging detector. Alignment of the substrate alignment mark 23 to the imprint template alignment mark 15 using the imaging detector 24 may be referred to as coarse alignment. The coarse alignment may be sufficiently accurate to align the substrate alignment mark 23 and the imprint template alignment mark 15 to within half of a grating period.

Once coarse alignment using the imaging detector 24 has been completed, alignment using the intensity detector 14 is then performed (this may be referred to as fine alignment). As described further above, the zero-order redirected alignment radiation which is received from the imprint template alignment mark 15 and the substrate alignment mark 23 will have an intensity which varies as a function of their relative alignment. In a first alignment step, the substrate 22 is moved in the x-direction, such that the x-direction grating of the substrate alignment mark 23 moves beneath the x-direction grating 30 of the imprint template alignment mark 15. This causes a modulation of the intensity of radiation received at the intensity detector 14. This modulation may be used by the processor 19 to determine an aligned position of the substrate alignment mark 23 relative to the imprint template alignment mark 15 in the x-direction.

During alignment, fluctuations of the intensity of the alignment radiation beam 11 are detected by the reference intensity detector 20. The processor 19 uses the intensity detected by the reference intensity detector 20 to correct the signal detected at the intensity detector 14 for intensity fluctuations of the alignment radiation beam. In an embodiment, the stability of the laser 10 may be sufficiently high that a reference intensity detector is not required.

In order to achieve alignment of the substrate alignment mark 23 and the imprint template alignment mark 15 in the y-direction, the substrate is moved in the y-direction. Intensity modulation arising as a result of the movement in the y-direction is detected at the intensity detector 14. The processor 19 uses the intensity modulation to determine an aligned position in the y-direction of the substrate alignment mark 23 relative to the imprint template alignment mark 15.

An advantage over a conventional imprint lithography alignment apparatus and method is provided in that it does not require a detector which is dedicated to alignment in the x-direction and a separate detector which is dedicated to alignment in the y-direction, but instead uses a single intensity detector to achieve alignment in the x and y directions. The intensity detector 14 is a non-imaging detector. The intensity detector 14 thus does not detect an image of the alignment mark, but merely detects the intensity of alignment radiation which is incident upon the detector. Since the intensity detector 14 is a non-imaging detector and provides a single output (the intensity signal), analysis of the output of the intensity detector by the processor 19 is relatively straightforward and robust (compared with analysis of an image).

An additional or alternative advantage is that it requires only a single alignment radiation beam 11 to achieve alignment in the x and y directions, rather than requiring two alignment radiation beams (as is the case in some prior imprint lithography alignment apparatus and methods).

The switchable polarizer 26 may be used to select an appropriate polarization of the alignment radiation beam 11 which will enhance the contrast of radiation redirected from the alignment marks 15, 23. The switchable polarizer 26 may be switched between a first orientation which provides enhanced contrast for gratings extending in the x-direction and a second orientation which provides enhanced contrast for gratings extending in the y-direction.

In an embodiment, the aligned position of more than one imprint template alignment mark and associated substrate alignment mark may be performed before imprinting takes place. This may be performed, for example, using a separate alignment apparatus for each imprint template alignment mark. In an embodiment the imprint template 16 is square or rectangular, and is provided with an imprint template alignment mark at or adjacent to each corner. Alignment of each of these imprint template alignment marks to an associated substrate alignment mark may be performed. Each of these four alignments may be performed by a separate alignment apparatus. The laser 10 may be used to provide the alignment radiation beam 11 for more than one alignment apparatus. The detector 14 may be used to detect the intensity of the alignment radiation beam redirected from more than one alignment mark (this may be done in series).

Once alignment has been completed, the size of the imprint template 16 may be modified to correct for a 'magnification error' (if necessary). The imprintable medium located between the imprint template and the substrate is then hardened, for example by exposing it to UV radiation. Any suitable method of hardening the imprintable medium may be used, including the methods described further above. The imprint template 16 may then be removed from the imprintable medium, and the substrate 22 moved laterally so that the imprint template is above a different part of the substrate. Alignment of the imprint template 16 and the substrate 22 may then be repeated, following which the imprintable medium beneath the imprint template may again be hardened.

Figure 5:
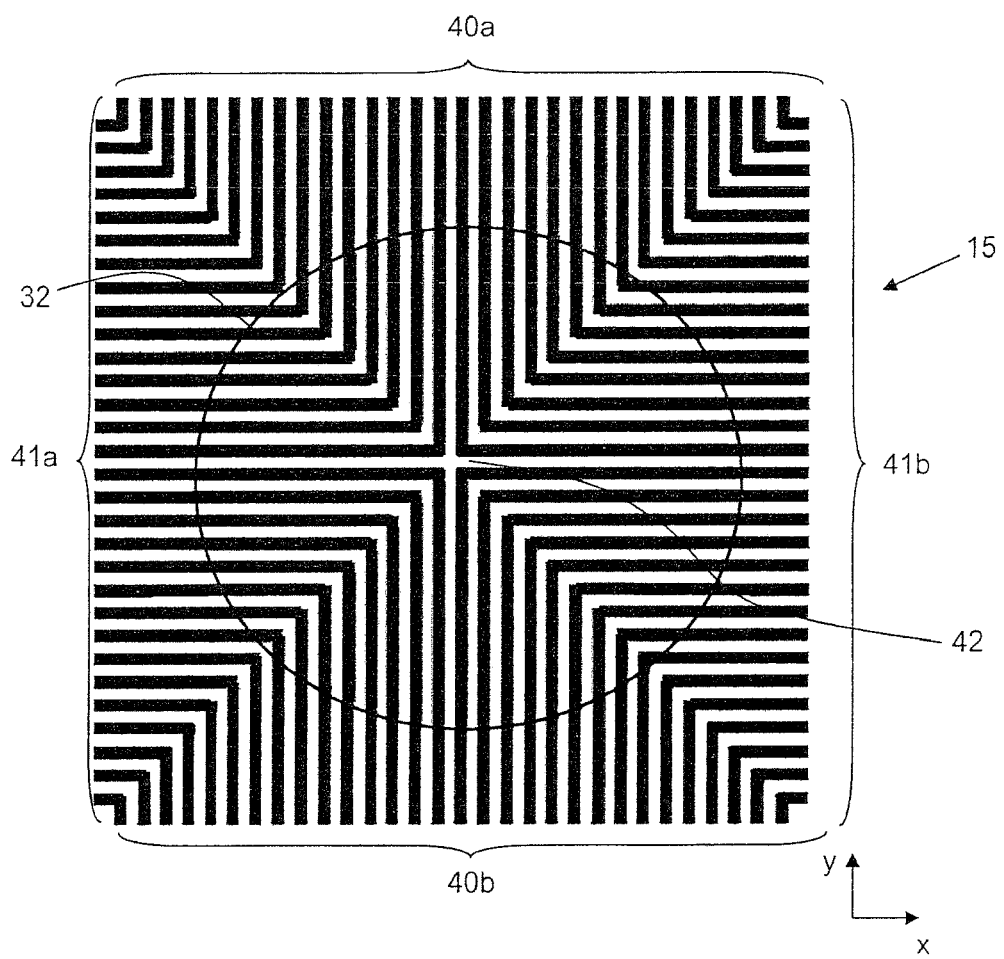

An imprint template alignment mark which may be used according to an an embodiment of the invention is shown in FIG. 5. The imprint template alignment mark 15 comprises two gratings 40a,b which extend in the x-direction, and two gratings 41a,b which extend in the y-direction. The gratings 40a,b, 41a,b are shaped as right-angled triangles, with the right-angles all coming together at a central location 42. Equivalently, the imprint template alignment mark 15 may be described as being four gratings with adjacent boundaries defined by two mutually perpendicular lines. The imprint template alignment mark 15 is square in shape. The gratings may be formed as triangles other than right-angle triangles (e.g. any suitable isosceles triangle). The x-direction gratings 40a,b and the y-direction gratings 41a,b may have the same pitch, or may have different pitches. The pitch of the gratings 40a,b, 41a,b may be, for example, between 500 nanometers and 10 microns. The imprint template alignment mark 15 may, for example, have a length of between 40 microns and 100 microns and may, for example, have a width of between 40 microns and 100 microns.

The alignment radiation spot 32 is shown in FIG. 5. It can be seen that the alignment radiation spot overlaps the x-direction gratings 40a,b and the y-direction gratings 41a,b. Thus, the imprint template alignment grating 15 of FIG. 5 may be used to achieve alignment in both the x and the y directions. The manner in which alignment is achieved using the imprint template alignment mark 15 of FIG. 5 is the same as that described further above in relation to FIG. 4.

In an embodiment, the imprint template alignment mark may comprise two gratings which extend in the x-direction and two gratings which extend in the y-direction. These four gratings may be arranged in a square or rectangle, with gratings extending In the x-direction being at opposite corners and gratings extending in the y-direction being at opposite corners. A cross or some other indicator may be provided at the center of the imprint template alignment mark.

In the above description, reference has been made to moving the substrate 22 in the x-direction and y-direction. The substrate 22 may be moved in the positive x-direction, negative x-direction, positive y-direction and the negative y-direction.

In the above description, the substrate 22 is moved relative to the imprint template 16 during fine alignment. In an embodiment the imprint template may be moved relative to the substrate. In an embodiment both the imprint template 16 and the substrate 22 may be moved.

Cartesian coordinates have been used in the description of the invention in order to facilitate a simple explanation of the invention. The Cartesian coordinates should not be interpreted as applying a limitation to the orientation of the substrate 22 or the imprint template 16, or indeed to any other element.

In described embodiments the alignment mark gratings extend in perpendicular directions. However, the alignment mark gratings may extend in substantially perpendicular directions (i.e. it is not essential that the gratings are precisely perpendicular directions). The alignment mark gratings may extend in directions which are neither perpendicular nor substantially perpendicular. For example, the alignment mark gratings may extend in directions which subtend any suitable angle. The substrate 22 and/or the imprint template 16 may be moved in corresponding directions during fine alignment.

The imprint template 16 may be held in an imprint template holder (not illustrated).

The imprint template may for example have a patterned area which measures 25×25 mm or 26×32 mm, or may have a patterned area with some other suitable dimensions.

The imprint template 16 may be provided with a single pattern, which for example forms a layer of a single integrated circuit. Alternatively, the imprint template 16 may be provided with multiple patterns, which for example each form a layer of an integrated circuit. In an embodiment, the imprint template may be sufficiently large to imprint a pattern onto the entire substrate during a single imprint.

Although FIG. 2 shows a particular apparatus according to an embodiment of the invention, other apparatus may be used. For example, the apparatus may be modified by placing the laser 10, imaging detector 24, and/or intensity detector 14 in different locations.

In an embodiment, the laser 10 may be replaced with any other suitable source. The source may be located away from the lithographic apparatus, with radiation being coupled to the lithographic apparatus using a radiation beam coupling apparatus (for example, fiber optics). Where this is the case the radiation beam coupling apparatus may be considered to be a radiation beam outlet. Similarly, a source located in the lithographic apparatus may be considered to be a radiation beam outlet.

In an embodiment the detectors 14, 20, processor 19, etc. may be moveable, and may be moved away from the imprint template after alignment has been completed. A moveable stage may be used to allow this movement to take place. Moving the detectors 14, 20, processor 19, etc. away from the imprint template allows UV radiation to be directed more easily onto the imprintable medium 27 (for example if UV imprint lithography is being used).

In FIGS. 2 and 3 the alignment radiation beam 11 is perpendicularly incident upon the imprint template alignment mark 15. In an embodiment however, the alignment radiation beam may be incident upon the imprint template alignment mark 15 at some other angle. This may, for example, allow the laser 10, detectors 14, 20, processor 19, etc to be located at sides of the imprint template 16, thereby avoiding obstruction of UV radiation (for example if UV imprint lithography is being used).

Embodiments of the invention may omit non-essential components, such as the switchable polarizer 26 and the focusing optics 17.

In an embodiment, there is provided a method of aligning a substrate and an imprint template, the method comprising: directing an alignment radiation beam towards an imprint template alignment mark of the imprint template and an adjacent substrate alignment mark of the substrate, the imprint template alignment mark and the substrate alignment mark each comprising a grating which extends in a first direction and a grating which extends in a second direction; providing relative movement between the imprint template and the substrate in the first direction and in the second direction; using an intensity detector to detect the intensity of alignment radiation redirected in the zero-order direction by the imprint template alignment mark and the substrate alignment mark during the relative movement in the first direction and in the second direction; and determining an aligned position of the imprint template alignment mark and the substrate alignment mark based upon the detected intensity.

In an embodiment, the intensity detector is a photodiode. In an embodiment, the method further comprises using a reference intensity detector to detect variation of the intensity of the alignment radiation beam before the alignment radiation beam is incident upon the imprint template alignment mark. In an embodiment, coarse alignment of the substrate and the imprint template is performed using an imaging detector before using the intensity detector to detect the intensity of alignment radiation redirected in the zero-order direction during the relative movement. In an embodiment, the relative movement is obtained by moving the substrate. In an embodiment, the grating which extends in the first direction and the grating which extends in the second direction are located adjacent to one another, such that the imprint template alignment mark is rectangular or square. In an embodiment, the imprint template alignment mark and the substrate alignment mark each comprise a pair of triangular gratings which extend in the first direction and a pair of triangular gratings which extend in the second direction, the triangular gratings having apexes which come together at a central location. In an embodiment, the alignment radiation beam forms a spot on the imprint template alignment mark which does not extend beyond the imprint template alignment mark. In an embodiment, the second direction is substantially perpendicular to the first direction.

In an embodiment, there is provided an imprint lithography alignment apparatus comprising: an alignment radiation source outlet configured to provide an alignment radiation beam at an imprint template alignment mark and a substrate alignment mark, the imprint template alignment mark and the substrate alignment mark each comprising a grating which extends in a first direction and a grating which extends in a second direction; an intensity detector to detect the intensity of alignment radiation redirected in the zero-order direction by the imprint template alignment mark and the substrate alignment mark; an actuator to generate relative movement between the substrate and the imprint template in the first direction and in the second direction; and a processor to determine an aligned position of the imprint template alignment mark and the substrate alignment mark based upon the detected intensity.

In an embodiment, the intensity detector is a photodiode. In an embodiment, the apparatus further comprises a reference intensity detector to detect variation of the intensity of the alignment radiation beam before the alignment radiation beam is incident upon the imprint template alignment mark. In an embodiment, the apparatus further comprises an imaging detector to allow coarse alignment of the substrate and the imprint template to be performed. In an embodiment, the actuator is configured to move a substrate table on which the substrate may be held, the actuator providing the relative movement by moving the substrate table. In an embodiment, the apparatus is configured such that the alignment radiation beam forms a spot on the imprint template alignment mark which does not extend beyond the imprint template alignment mark. In an embodiment, the second direction is substantially perpendicular to the first direction.

In an embodiment, there is provided an imprint template alignment mark comprising a first grating which extends in a first direction and a second adjacent grating which extends in a second substantially perpendicular direction, the first and second gratings together forming a square or rectangle, and the imprint template alignment mark comprising no additional gratings.

In an embodiment, there is provided an imprint template alignment mark comprising a pair of triangular gratings which extend in a first direction and a pair of triangular gratings which extend in a second direction transverse to the first direction, the triangular gratings having apexes which come together at a central location.

The present invention relates to imprint lithography apparatus and methods. The apparatus and/or methods may be used for the manufacture of devices, such as electronic devices and integrated circuits or other applications, such as the manufacture of integrated optical systems, guidance and detection patterns for magnetic domain memories, flat-panel displays, liquid-crystal displays (LCDs), thin film magnetic heads, organic light emitting diodes, etc.

In this specification, the term "substrate" is meant to include any surface layers forming part of the substrate, or being provided on another substrate, such as a planarization layer or anti-reflective coating layer.

In the above embodiments, a single imprint template, a single imprint template holder, a single substrate table and a single substrate is provided in a single chamber. In other embodiments, more than one imprint template, more than one imprint template holder, more than one substrate table, and/or more than one substrate may be provided in one or more chambers, in order for imprints to be undertaken more efficiently or quickly (e.g. in parallel). For example, in an embodiment, there is provided an apparatus that includes a plurality (e.g. 2, 3, or 4) of substrate tables. In an embodiment, there is provided an apparatus that includes a plurality (e.g. 2, 3, 4, 5, 6, 7 or 8 or more) of imprint templates. In an embodiment, there is provided an apparatus configured to use one template holder arrangement per substrate table. In an embodiment, there is provided an apparatus configured to use more than one template holder arrangement per substrate table. In an embodiment, there is provided an apparatus that includes a plurality (e.g. 2, 3, or 4) of imprintable medium dispensers. In an embodiment, there is provided an apparatus configured to use one imprintable medium dispenser per substrate table.

In an embodiment, there is provided an apparatus configured to use one imprintable medium dispenser per imprint template arrangement. In an embodiment, where an apparatus is provided that includes a plurality of substrate tables, the substrate tables may share functionalities in the apparatus. For instance, the substrate tables may share a substrate handler, a substrate cassette, a gas supply system (e.g. to create a helium environment during imprinting), an imprintable medium dispenser, and/or a radiation source (for curing the imprintable medium). In an embodiment, two or more of the substrate tables (e.g. 3 or 4) share one or more functionalities of the apparatus (e.g. 1, 2, 3, 4, or 5 functionalities). In an embodiment, one or more functionalities (e.g. 1, 2, 3, 4, or 5) of the apparatus are shared among all substrate tables.

The invention claimed is:

1. A method of aligning a substrate and an imprint template, the method comprising:
   directing an alignment radiation beam towards an imprint template alignment mark of the imprint template and an adjacent substrate alignment mark of the substrate, the imprint template alignment mark and the substrate alignment mark each comprising a grating which extends in a first direction and a grating which extends in a second direction;
   providing relative movement between the imprint template and the substrate in the first direction and in the second direction;
   using an intensity detector to detect the intensity of alignment radiation redirected in the zero-order direction by the imprint template alignment mark and the substrate alignment mark during the relative movement in the first direction and in the second direction; and
   determining an aligned position of the imprint template alignment mark and the substrate alignment mark based upon the detected intensity.

2. The method of claim 1, wherein the intensity detector is a photodiode.

3. The method of claim 1, further comprising using a reference intensity detector to detect variation of the intensity of the alignment radiation beam before the alignment radiation beam is incident upon the imprint template alignment mark.

4. The method of claim 1, wherein coarse alignment of the substrate and the imprint template is performed using an imaging detector before using the intensity detector to detect the intensity of alignment radiation redirected in the zero-order direction during the relative movement.

5. The method of claim 1, wherein the relative movement is obtained by moving the substrate.

6. The method of claim 1, wherein the grating which extends in the first direction and the grating which extends in the second direction are located adjacent to one another, such that the imprint template alignment mark is rectangular or square.

7. The method of claim 1, wherein the imprint template alignment mark and the substrate alignment mark each comprise a pair of triangular gratings which extend in the first direction and a pair of triangular gratings which extend in the second direction, the triangular gratings having apexes which come together at a central location.

8. The method of claim 1, wherein the alignment radiation beam forms a spot on the imprint template alignment mark which does not extend beyond the imprint template alignment mark.

9. The method of claim 1, wherein the second direction is substantially perpendicular to the first direction.

10. An imprint lithography alignment apparatus comprising:
    an alignment radiation source outlet configured to provide an alignment radiation beam at an imprint template alignment mark and a substrate alignment mark, the imprint template alignment mark and the substrate alignment mark each comprising a grating which extends in a first direction and a grating which extends in a second direction;
    an intensity detector to detect the intensity of alignment radiation redirected in the zero-order direction by the imprint template alignment mark and the substrate alignment mark;
    an actuator to generate relative movement between the substrate and the imprint template in the first direction and in the second direction; and
    a processor to determine an aligned position of the imprint template alignment mark and the substrate alignment mark based upon the detected intensity during the relative movement in the first direction and in the second direction.

11. The apparatus of claim 10, wherein the intensity detector is a photodiode.

12. The apparatus of claim 10, further comprising a reference intensity detector to detect variation of the intensity of the alignment radiation beam before the alignment radiation beam is incident upon the imprint template alignment mark.

13. The apparatus of claim 10, further comprising an imaging detector to allow coarse alignment of the substrate and the imprint template to be performed.

14. The apparatus of claim 10, wherein the actuator is configured to move a substrate table on which the substrate may be held, the actuator providing the relative movement by moving the substrate table.

15. The apparatus of claim 10, wherein the apparatus is configured such that the alignment radiation beam forms a spot on the imprint template alignment mark which does not extend beyond the imprint template alignment mark.

16. The apparatus of claim 10, wherein the second direction is substantially perpendicular to the first direction.

* * * * *